US012689223B2

(12) United States Patent　　(10) Patent No.: US 12,689,223 B2
Odaka et al.　　(45) Date of Patent: Jul. 21, 2026

(54) ELECTRIC WORKING MACHINE WITH ELECTRIC BATTERY POWER

(71) Applicant: HONDA MOTOR CO., LTD., Tokyo (JP)

(72) Inventors: Takuya Odaka, Wako (JP); Kenta Sugitate, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 821 days.

(21) Appl. No.: 17/955,587

(22) Filed: Sep. 29, 2022

(65) Prior Publication Data

US 2024/0107940 A1　　Apr. 4, 2024

(51) Int. Cl.
| | |
|---|---|
| *H02J 7/00* | (2026.01) |
| *A01D 34/78* | (2006.01) |
| *A01D 34/81* | (2006.01) |
| *A01D 69/02* | (2006.01) |
| *B60K 1/02* | (2006.01) |
| *H02J 7/70* | (2026.01) |
| *H02J 9/00* | (2006.01) |
| *B60N 2/38* | (2006.01) |
| *H01H 73/08* | (2006.01) |
| *H01H 85/20* | (2006.01) |
| *H01R 13/447* | (2006.01) |
| *H01R 31/08* | (2006.01) |
| *H05K 3/28* | (2006.01) |

(52) U.S. Cl.
CPC ............... *H02J 7/00* (2013.01); *A01D 34/78* (2013.01); *A01D 34/81* (2013.01); *A01D 69/02* (2013.01); *B60K 1/02* (2013.01); *H02J 7/751* (2026.01); *H02J 9/00* (2013.01); *B60N 2/38* (2013.01); *H01H 73/08* (2013.01); *H01H 2085/207* (2013.01); *H01R 13/447* (2013.01); *H01R 31/08* (2013.01); *H05K 3/284* (2013.01); *Y10S 439/911* (2013.01); *Y10S 439/952* (2013.01)

(58) Field of Classification Search
CPC ........ A01D 34/78; A01D 34/81; A01D 69/02; H02J 7/0045; H02J 7/00; H02J 9/00; B60K 1/02; B60N 2/38; H01H 73/08; H01H 2085/207; H01R 31/08
See application file for complete search history.

(56) References Cited

U.S. PATENT DOCUMENTS

| | | | | |
|---|---|---|---|---|
| 4,870,811 | A | * | 10/1989 | Steele .................. A01D 34/001 56/10.8 |
| 5,085,043 | A | * | 2/1992 | Hess ...................... A01D 69/02 56/10.8 |

(Continued)

FOREIGN PATENT DOCUMENTS

| | | | | | |
|---|---|---|---|---|---|
| CA | | 3095531 | A1 | * 10/2021 | ............. H01R 13/64 |
| CN | | 201557390 | U | * 8/2010 | ............ B60L 3/0061 |

(Continued)

*Primary Examiner* — Arpad Fabian-Kovacs

(74) *Attorney, Agent, or Firm* — Amin, Turocy & Watson, LLP

(57) ABSTRACT

An electric working machine includes a machine body, a motor mounted on the machine body and driven by electric power supplied from a battery, a working part driven by motive power of the motor to perform work, and a cover that covers the motor. The cover includes an output terminal for supplying the electric power of the battery to the outside.

11 Claims, 10 Drawing Sheets

(56)                  References Cited

U.S. PATENT DOCUMENTS

| | | | | | |
|---|---|---|---|---|---|
| 5,301,494 | A * | 4/1994 | Peot | | H02J 7/0045 |
| | | | | | 439/511 |
| 5,727,372 | A * | 3/1998 | Kanitz | | A01D 34/78 |
| | | | | | 56/11.9 |
| 5,736,837 | A * | 4/1998 | Noda | | H01M 10/46 |
| | | | | | 320/111 |
| 5,802,824 | A * | 9/1998 | Aldrich | | A01D 34/64 |
| | | | | | 56/13.6 |
| 5,809,758 | A * | 9/1998 | Flanigan | | A01D 34/001 |
| | | | | | D15/15 |
| 6,018,937 | A * | 2/2000 | Shimada | | H01R 13/44 |
| | | | | | 56/16.7 |
| 6,533,055 | B2 * | 3/2003 | Matsuura | | B62D 25/12 |
| | | | | | 280/727 |
| 6,541,718 | B2 * | 4/2003 | Burkholder | | H01R 13/447 |
| | | | | | 200/50.28 |
| 6,675,562 | B2 * | 1/2004 | Lawrence | | A01D 34/6806 |
| | | | | | 56/2 |
| 6,750,556 | B2 * | 6/2004 | Sodemann | | F02B 63/04 |
| | | | | | 123/3 |
| 6,826,895 | B2 * | 12/2004 | Iida | | A01D 34/828 |
| | | | | | 56/11.9 |
| 7,794,280 | B1 * | 9/2010 | Markyvech | | B60L 50/16 |
| | | | | | 320/120 |
| 8,653,786 | B2 | 2/2014 | Baetica et al. | | |
| 8,935,907 | B2 * | 1/2015 | Abe | | A01D 34/78 |
| | | | | | 56/320.1 |
| 9,150,171 | B2 * | 10/2015 | Kim | | B60N 2/879 |
| 9,296,306 | B2 * | 3/2016 | Schygge | | B60L 53/16 |
| 9,711,767 | B2 * | 7/2017 | Juenger | | A01D 69/02 |
| 9,787,225 | B2 * | 10/2017 | Lucas | | E01H 5/045 |
| 9,867,331 | B1 * | 1/2018 | Siudyla | | B62D 11/04 |
| 10,098,278 | B2 * | 10/2018 | Velderman | | A01D 34/78 |
| 10,111,378 | B2 * | 10/2018 | Yamagishi | | H01M 10/486 |
| 10,868,435 | B2 * | 12/2020 | Hoppel | | A01D 43/16 |
| 11,291,157 | B2 * | 4/2022 | Hoppel | | A41D 13/0051 |
| 2004/0135373 | A1 * | 7/2004 | Osborne | | A01D 69/02 |
| | | | | | 290/1 A |
| 2019/0075726 | A1 * | 3/2019 | White | | A01D 34/824 |
| 2019/0260210 | A1 * | 8/2019 | Peloquin, Jr. | | H02J 3/008 |
| 2022/0410762 | A1 * | 12/2022 | Yang | | A01D 69/02 |
| 2023/0225252 | A1 * | 7/2023 | Liu | | A01D 34/78 |
| | | | | | 56/11.9 |

FOREIGN PATENT DOCUMENTS

| | | | | | | |
|---|---|---|---|---|---|---|
| CN | 203423971 | U | * | 2/2014 | | H01M 50/204 |
| CN | 206041585 | U | * | 3/2017 | | H02J 7/00 |
| CN | 111436181 | A | * | 7/2020 | | A01D 34/006 |
| CN | 111448884 | A | * | 7/2020 | | A01D 34/78 |
| CN | 219204107 | U | * | 6/2023 | | H02J 7/00 |
| CN | 117918128 | A | * | 4/2024 | | H02J 7/0042 |
| CN | 118205496 | A | * | 6/2024 | | B60L 1/006 |
| EP | 2875712 | A1 | * | 5/2015 | | A01D 69/02 |
| WO | WO-2017013602 | A1 | * | 1/2017 | | B60K 25/00 |
| WO | WO-2021071655 | A1 | * | 4/2021 | | H02J 7/0063 |
| WO | WO-2024081399 | A2 | * | 4/2024 | | H02J 7/0042 |

* cited by examiner

ELECTRIC WORKING MACHINE WITH ELECTRIC BATTERY POWER

BACKGROUND OF THE INVENTION

Field of the Invention

The present invention relates to an electric working machine in which a working part is operated by electric power of a battery.

Description of the Related Art

U.S. Pat. No. 8,653,786 B2 discloses an electric working machine on which a battery is detachably mounted. The electric working machine includes a battery, a controller, a cutting mechanism, and a drive mechanism. The drive mechanism is driven by electric power from the battery based on a control signal from the controller. When the drive mechanism is driven, the electric working machine travels. When the drive mechanism is driven, the blade of the cutting mechanism is driven and lawn grass is cut by the blade.

The machine body of the electric working machine includes a first battery connector connectable to the battery, and a second battery connector connectable to a charger cable. In a state where the battery is accommodated in the machine body, electric power is supplied from the second battery connector to the battery through the charging cable connected to an external power supply. Thus, the battery is charged.

SUMMARY OF THE INVENTION

The electric working machine of U.S. Pat. No. 8,653,786 B2 is used to perform work outdoors, and there is a demand for supplying electric power of the battery to an external device and using the electric power outdoors. However, although it is possible to supply electric power from the external power supply to the battery of the electric working machine to charge the battery, the electric power of the battery cannot be supplied to the external device.

An object of the present invention is to solve the above-mentioned problem.

According to an aspect of the present invention, provided is an electric working machine comprising: a machine body; a motor mounted on the machine body and driven by electric power supplied from a battery; a working part driven by motive power of the motor and configured to perform work; and a cover configured to cover the motor, the electric working machine further comprising an output terminal disposed on the cover and configured to supply the electric power of the battery to an outside.

According to the present invention, since the cover that covers the motor includes the output terminal, electric power of the battery can be supplied from the output terminal to the external device. As a result, in the outdoors where the electric working machine is used, the electric working machine can be used as a mobile power source for the external device to supply electric power to the external device.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 5 is a configuration diagram of a circuit of the electric working machine;

FIG. 9 is an enlarged front view of the display device on which a second screen is displayed.

DETAILED DESCRIPTION OF THE INVENTION

Figure 1:
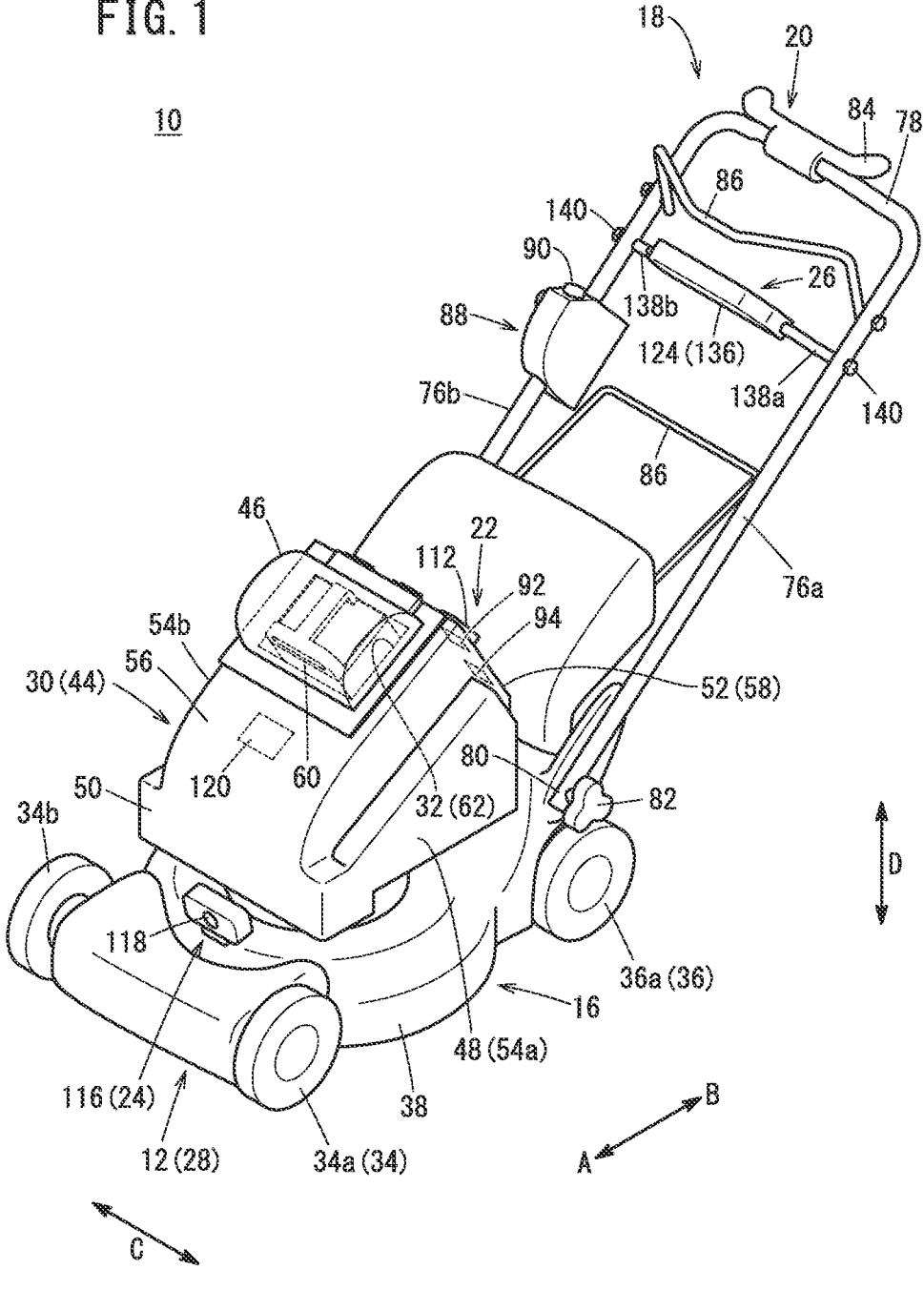
FIG. 1 is an external perspective view of an electric working machine according to an embodiment of the present invention.

As shown in FIG. 1, an electric working machine 10 according to the present embodiment is, for example, an electric lawn mower for cutting lawn grass. Hereinafter, a case where the electric working machine 10 is used as an electric lawn mower will be described. Note that the electric working machine 10 may be an electric grass mower, a snowplow, agricultural equipment (such as a cultivator), a pressure washer, a forklift, or the like.

An arrow A direction shown in FIG. 1 indicates a forward direction which is a traveling direction of the electric working machine 10. An arrow B direction shown in FIG. 1 indicates a rearward direction opposite to the traveling direction of the electric working machine 10. An arrow C direction shown in FIG. 1 indicates a left-right direction perpendicular to the traveling direction of the electric working machine 10. An arrow D direction shown in FIG. 1 indicates a vertical direction perpendicular to the traveling direction of the electric working machine 10.

As shown in FIG. 1, the electric working machine 10 includes a machine body 12, a motor 14 (see FIG. 3), a working part 16, a handle 18, an operation part 20, an output terminal 22, a sensor 24, and a display device 26. The electric working machine 10 is a walking type working machine, and moves when a user M (see FIG. 2) operates the handle 18. The electric working machine 10 is not limited to a walking type working machine, and may be, for example, an electric working machine that moves with the user M riding thereon.

Figure 2:
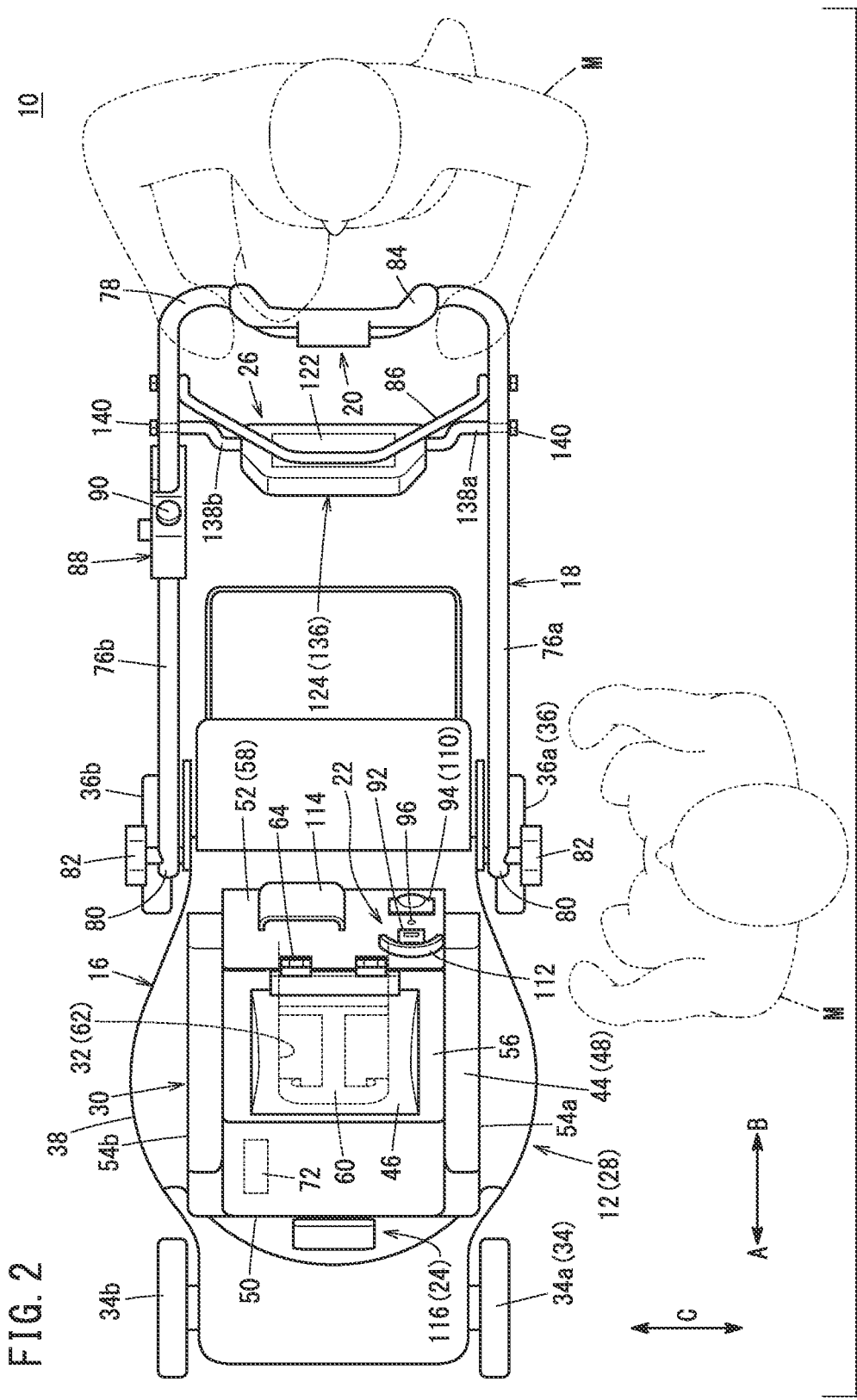
FIG. 2 is a plan view of the electric working machine shown in FIG. 1.

As shown in FIG. 2, the machine body 12 includes a body 28, a cover 30, and a battery accommodating portion 32. Front wheels 34 are disposed at the front portion of the body 28. The front wheels 34 include a left front wheel 34a and a right front wheel 34b that are separated from each other in the left-right direction of the body 28 (the arrow C direction). The left front wheel 34a and the right front wheel 34b are coupled to each other by a shaft (not shown). Rear wheels 36 are disposed at the rear portion of the body 28. The rear wheels 36 include a left rear wheel 36a and a right rear wheel 36b that are separated from each other in the left-right direction of the body 28 (the arrow C direction). The left rear wheel 36a and the right rear wheel 36b are coupled to each other by a shaft (not shown).

Figure 3:
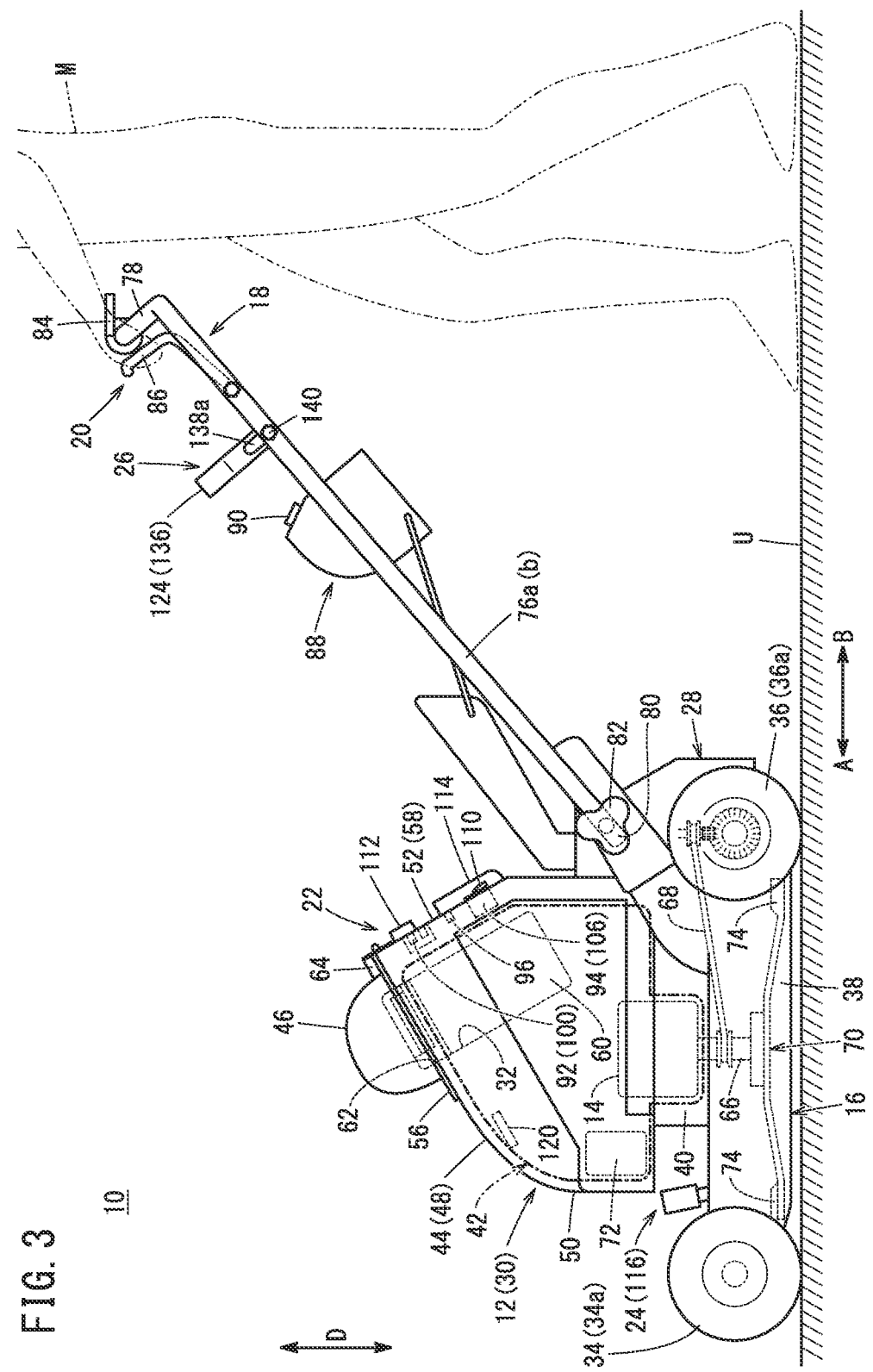
FIG. 3 is a side view of the electric working machine shown in FIG. 1.

As shown in FIG. 3, the central portion of the body 28 includes a blade accommodating portion 38, and a motor holding portion 40. The blade accommodating portion 38 has a circular shape opening downward (see FIG. 2). A cutter blade 70 of the working part 16 is accommodated in the blade accommodating portion 38. The motor holding portion 40 is disposed above the blade accommodating portion 38. The motor holding portion 40 supports a drive unit 42 including the motor 14.

The cover 30 is disposed above the body 28. The cover 30 is disposed between the front wheels 34 and the rear wheels 36 in the front-rear direction of the electric working machine 10 (the directions of arrows A and B) (see FIG. 2). The cover 30 is connected to the central portion of the body 28. The cover 30 includes a cover body 44 and an opening/closing cover 46. The cover body 44 has an outer surface 48 that covers the drive unit 42 including the motor 14.

The outer surface 48 of the cover body 44 has a front surface 50, a rear surface 52, a pair of side surfaces 54a and 54b, and a top surface 56. The front surface 50 is disposed at the front portion of the cover body 44 and faces forward (in the arrow A direction). The front surface 50 extends in the vertical direction (the arrow D direction).

Figure 4:
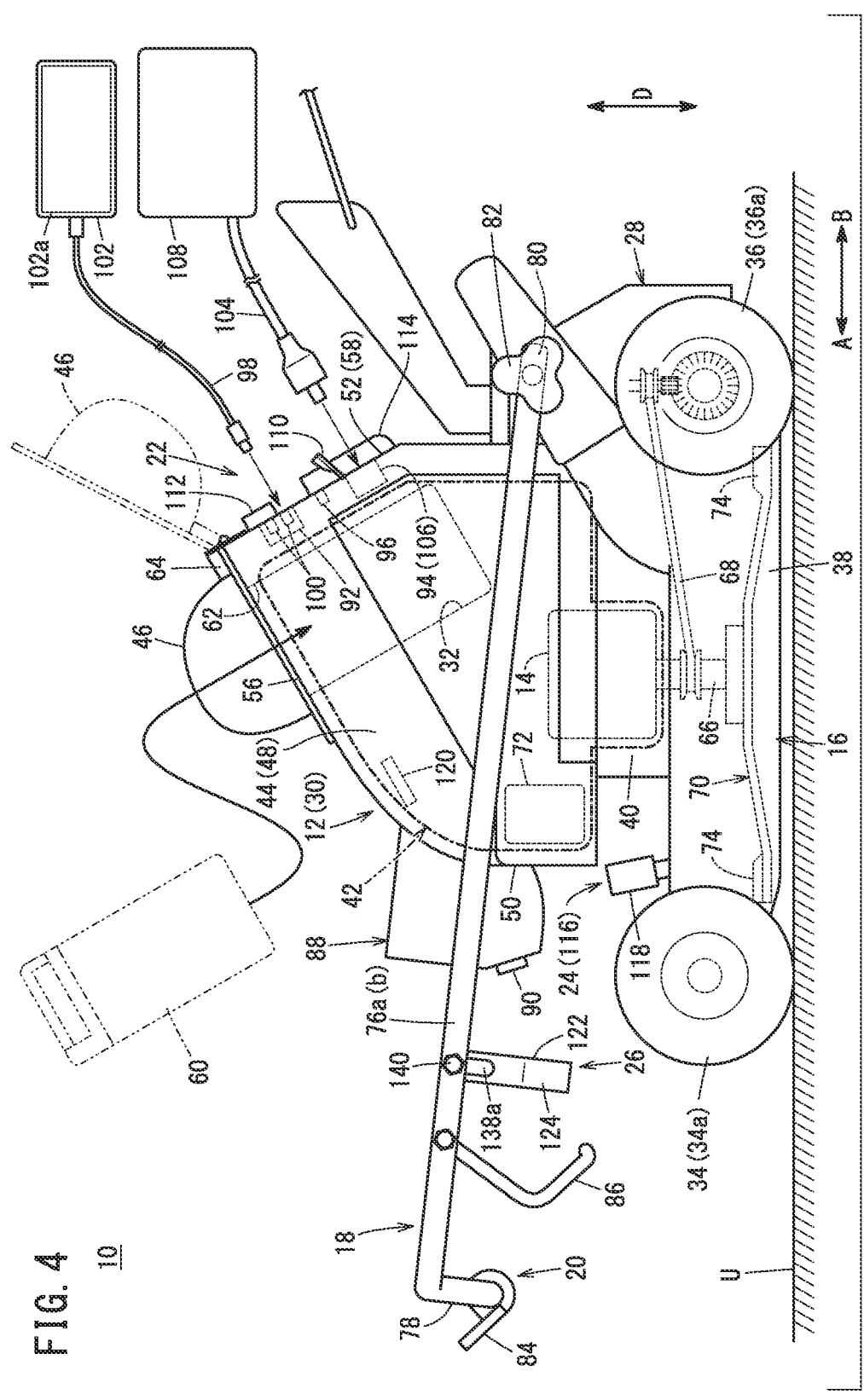
FIG. 4 is a side view showing a state in which a handle of the electric working machine of FIG. 3 is folded forward.

As shown in FIG. 4, the rear surface 52 is disposed at the rear portion of the cover body 44 and faces rearward (in the arrow B direction). The rear surface 52 has an inclined portion 58 that is inclined with respect to the vertical direction (the arrow D direction) and faces obliquely upward. The inclined portion 58 is an inclined surface that is inclined forward (in the arrow A direction) toward the upper side.

As shown in FIG. 2, the pair of side surfaces 54a and 54b extend along the front-rear direction of the machine body 12 (the directions of arrows A and B). The pair of side surfaces 54a and 54b connect the front surface 50 and the rear surface 52. As shown in FIG. 3, the top surface 56 is disposed on the upper portion of the cover body 44. The top surface 56 connects the upper portions of the front surface 50, the rear surface 52, and the pair of side surfaces 54a and 54b. The top surface 56 is inclined downward from the rear surface 52 toward the front surface 50. The top surface 56 is substantially orthogonal to the rear surface 52.

As shown in FIG. 3, the battery accommodating portion 32 can accommodate a battery 60 therein. The battery accommodating portion 32 is disposed inside the cover body 44. The battery accommodating portion 32 is disposed forward of (further in the arrow A direction than) the rear surface 52 of the cover body 44. The battery accommodating portion 32 is inclined with respect to the vertical direction (the arrow D direction) and is inclined forward toward the upper side. That is, the battery accommodating portion 32 is disposed along the rear surface 52 and substantially parallel to the rear surface 52.

The battery accommodating portion 32 includes an opening 62. The opening 62 is disposed in the top surface 56 of the cover body 44. The opening 62 opens in a rectangular shape in the top surface 56. When the battery 60 is attached to or detached from the battery accommodating portion 32, the battery 60 is inserted or removed through the opening 62 (see FIG. 4). The direction in which the opening 62 opens is a direction in which the battery accommodating portion 32 extends.

The opening/closing cover 46 opens and closes the opening 62. The opening/closing cover 46 is disposed above the top surface 56. The opening/closing cover 46 is disposed pivotally with respect to the top surface 56. A support end 64 of the opening/closing cover 46 is supported by the top surface 56 located in the vicinity of the rear end of the opening 62. When the opening/closing cover 46 pivots forward about the support end 64, the opening 62 is covered by the opening/closing cover 46. As shown in FIG. 4, when the opening/closing cover 46 pivots rearward about the support end 64, the opening/closing cover 46 separates away from the opening 62 to open the opening 62.

The motor 14 is mounted on the machine body 12 and supported by the motor holding portion 40 of the body 28. The motor 14 is disposed such that the axial direction thereof is the vertical direction (the arrow D direction). The motor 14 includes a drive shaft 66 which is rotationally driven. The drive shaft 66 of the motor 14 protrudes downward with respect to the motor holding portion 40. The distal end of the drive shaft 66 is disposed in the blade accommodating portion 38. The motor 14 is electrically connected to the battery 60 (see FIG. 4). The motor 14 is driven by electric power supplied from the battery 60.

The driving force of the motor 14 is transmitted to the rear wheels 36 by a power transmission belt 68. The rear wheels 36 are rotated by the driving force of the motor 14, whereby the electric working machine 10 travels along the traveling direction. The motor 14 functions as a power source for rotation of the cutter blade 70 and traveling of the electric working machine 10.

The working part 16 includes: the drive unit 42 including the motor 14; and the cutter blade 70. The drive unit 42 is mounted above the central portion of the body 28.

The drive unit 42 is formed by unitizing the battery 60, the motor 14, a controller 72, and the like. The drive unit 42 is accommodated inside the cover body 44 of the cover 30. The drive unit 42 is covered by the cover 30. The motor 14 is fixed to the motor holding portion 40 of the body 28, whereby the drive unit 42 is held above the body 28.

In the drive unit 42, the battery 60 is configured to be attachable and detachable. The battery 60 has a box shape in which battery cells are accommodated. The battery 60 is disposed above and diagonally behind the motor 14. The battery 60 is accommodated in the battery accommodating portion 32. As shown in FIG. 3, when the battery 60 is accommodated in the battery accommodating portion 32, the battery 60 is disposed so as to be inclined forward (in the arrow A direction) with respect to the vertical direction. The controller 72 is disposed forward of (further in the arrow A direction than) the battery 60.

Figure 5:
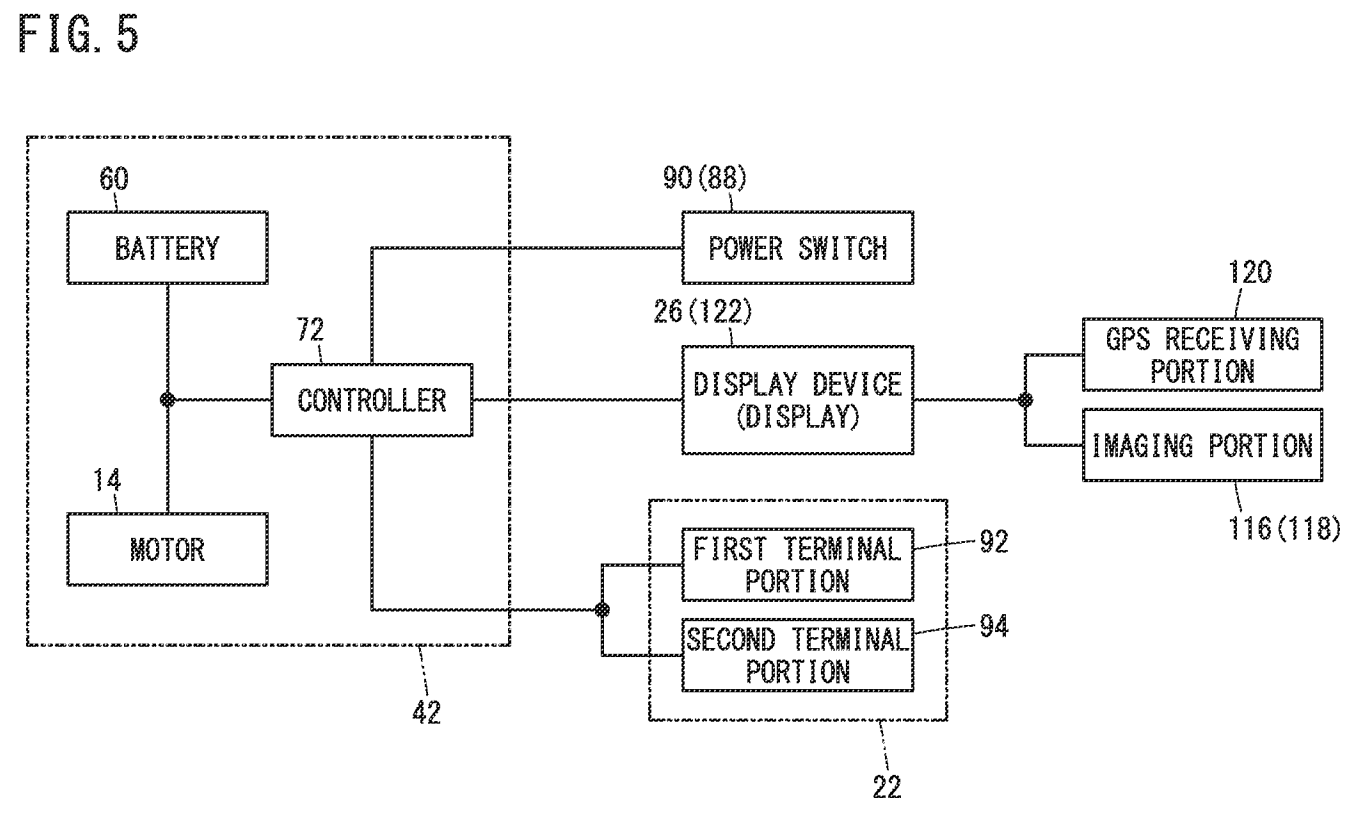

As shown in FIG. 5, the motor 14 and the battery 60 constituting the drive unit 42 are electrically connected to each other, and each of the motor 14 and the battery 60 is electrically connected to the controller 72. The controller 72 is capable of controlling the motor 14 and controlling supply of electric power of the battery 60.

As shown in FIG. 4, the cutter blade 70 is capable of cutting grass. The cutter blade 70 is accommodated in the blade accommodating portion 38. The cutter blade 70 faces a ground U having lawn thereon. The center of the cutter blade 70 is coupled to the drive shaft 66 of the motor 14. The outer edge portion of the cutter blade 70 includes a plurality of cutting edges 74. When the motor 14 is driven by electric power from the battery 60, the cutter blade 70 rotates about the drive shaft 66 of the motor 14 in the blade accommodating portion 38. When the cutter blade 70 rotates, the grass growing upward from the ground U is cut by the plurality of cutting edges 74.

As shown in FIG. 2, the handle 18 extends rearward (in the arrow B direction) with respect to the machine body 12. When the electric working machine 10 is caused to travel, the user M grips the handle 18.

The handle 18 includes a pair of support members 76a and 76b, a grip portion 78, and pivot portions 80. The pair of support members 76a and 76b are separated from each other and arranged in parallel in the left-right direction of the machine body 12 (the arrow C direction). The front end of the support member 76a is disposed adjacent to the left rear wheel 36a. The front end of the support member 76b is disposed adjacent to the right rear wheel 36b.

The grip portion 78 is gripped by the user M when working with the electric working machine 10. The grip portion 78 extends in the left-right direction of the machine body 12 (the arrow C direction). The rear end of the support member 76a and the rear end of the support member 76b are connected to each other by the grip portion 78. The handle 18 is formed in a U shape by the pair of support members 76a and 76b and the grip portion 78.

The pivot portions 80 are respectively disposed at the front ends of the pair of support members 76a and 76b. The pivot portions 80 are supported by the side surfaces 54a and 54b of the machine body 12. Each of the pivot portions 80 includes a fixing member 82 that fixes the corresponding one of the support members 76a and 76b to the machine body 12. The handle 18 can pivot about the front end thereof including the pivot portions 80. The fixing members 82 are inserted through the support members 76a and 76b and screwed to the side surfaces 54a and 54b of the machine body 12, respectively.

When the user M uses the electric working machine 10, as shown in FIG. 3, the handle 18 is pivoted to adjust the height of the grip portion 78 so that the grip portion 78 can be easily gripped by the user M, and then the handle 18 is fixed by the fixing members 82. As shown in FIG. 4, when the electric working machine 10 is not in use, the handle 18 is pivoted forward about the pivot portions 80 so that the grip portion 78 is located forward of the machine body 12 (in the arrow A direction). As a result, the handle 18 is folded so as to be close to the machine body 12. After the handle 18 is pivoted, the pivot portions 80 are fixed to the machine body 12 by the fixing members 82, whereby the pivoting motion of the handle 18 is prevented.

As shown in FIG. 2, the operation part 20 is disposed on the handle 18. The operation part 20 is electrically connected to the controller 72. The operation part 20 includes a movement operating portion 84 and a blade operating portion 86.

The movement operating portion 84 is disposed on the grip portion 78 of the handle 18. The operation of the motor 14 can be controlled by the user M operating the movement operating portion 84. When the user M operates the movement operating portion 84, the motor 14 is controlled and the electric working machine 10 moves forward or backward via the rear wheels 36.

The blade operating portion 86 is disposed in front of and away from the grip portion 78 of the handle 18 in the extending direction of the support members 76a and 76b. The blade operating portion 86 is disposed substantially parallel to the grip portion 78 of the handle 18. The blade operating portion 86 is pivotally disposed between the pair of support members 76a and 76b. As shown in FIG. 3, when the user M grips the blade operating portion 86 and pulls it toward the grip portion 78, the blade operating portion 86 is pivoted. As a result, the blade operating portion 86 approaches the grip portion 78 and the motor 14 is controlled, whereby the cutter blade 70 rotates by the driving force of the motor 14.

As shown in FIG. 2, the support member 76b of the handle 18 includes a power supply portion 88. The power supply portion 88 is disposed on the support member 76b disposed on the right side. The power supply portion 88 is disposed to be separated forward (in the arrow A direction) from the blade operating portion 86. The power supply portion 88 includes a power switch 90. When using the electric working machine 10, the user M operates the power switch 90 to turn on the electric working machine 10.

Figure 6A:
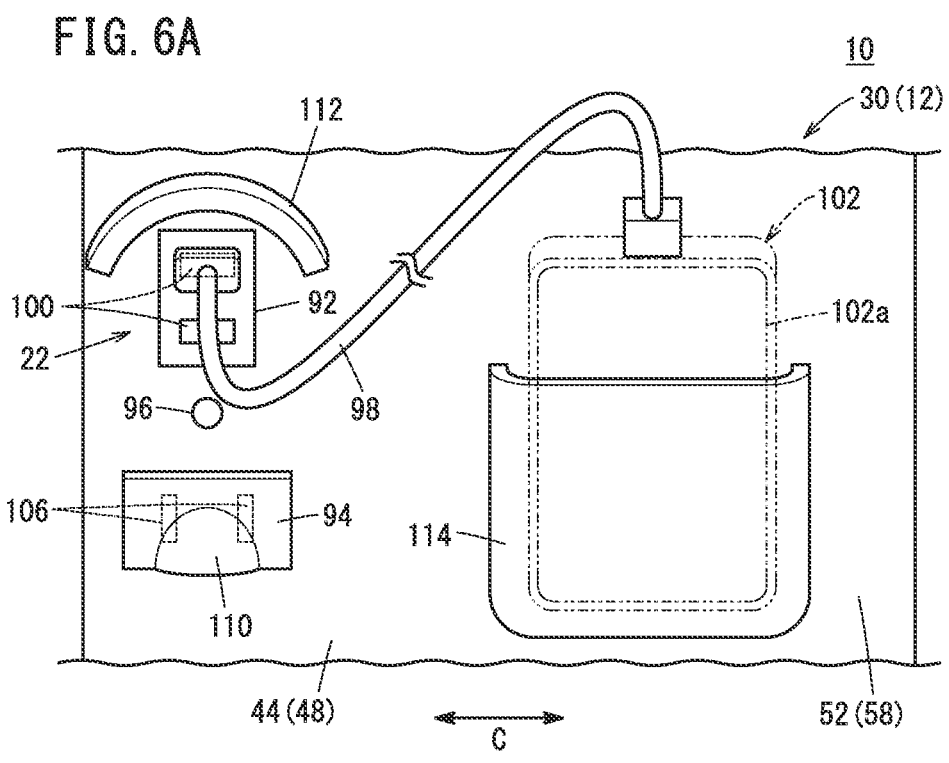
FIG. 6A is an enlarged front view of a cover of the electric working machine viewed from the rear side, wherein an output terminal is arranged on the left part of the cover.
Figure 6B:
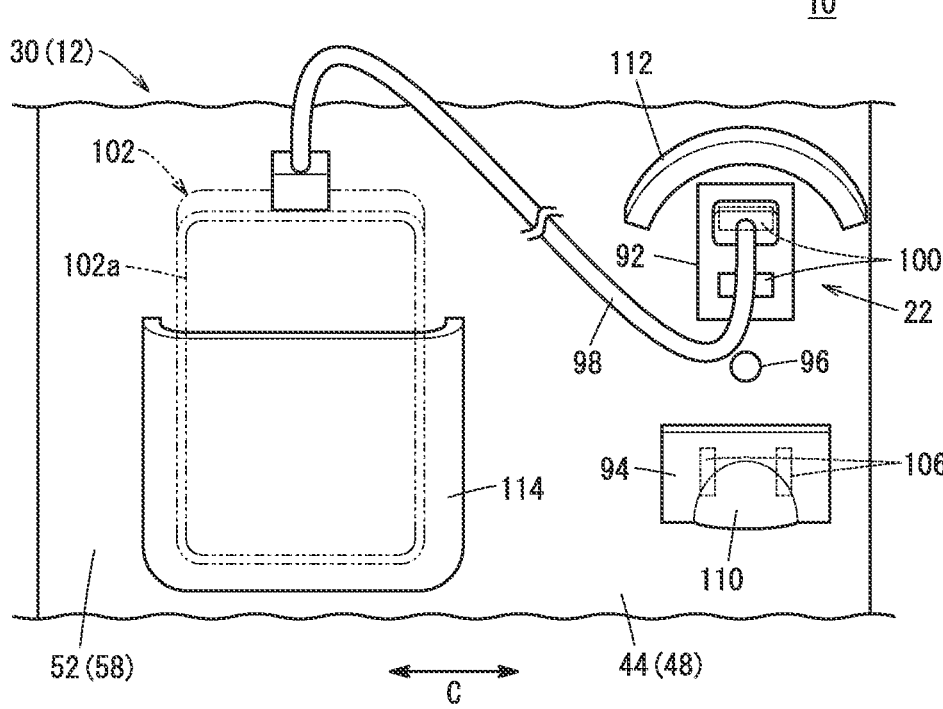
FIG. 6B is an enlarged front view of the cover of the electric working machine viewed from the rear side, wherein the output terminal is arranged on the right part the cover.

As shown in FIG. 2, the output terminal 22 is disposed on the rear surface 52 of the cover 30 and faces rearward (in the arrow B direction). The output terminal 22 is disposed on the inclined portion 58 of the rear surface 52. The output terminal 22 is disposed at a position rearward of (further in the arrow B direction than) the front wheels 34. When the electric working machine 10 shown in FIG. 6A is viewed from the rear side toward the front side, the output terminal 22 is disposed on the left part of the rear surface 52 of the cover 30. It should be noted that, as shown in FIG. 6B, the output terminal 22 may be disposed on the right part of the rear surface 52 of the cover 30.

As shown in FIG. 6A, the output terminal 22 include a first terminal portion 92, a second terminal portion 94, and a lamp 96.

The first terminal portion 92 is disposed substantially flush with the rear surface 52 of the cover body 44 (see FIG. 4). As shown in FIG. 5, the first terminal portion 92 is electrically connected to each of the display device 26 and the controller 72. The first terminal portion 92 is electrically connected to the battery 60 via the controller 72. The first terminal portion 92 is electrically connected to the battery 60 and is supplied with electric power from the battery 60.

Figures 7A, 7B:
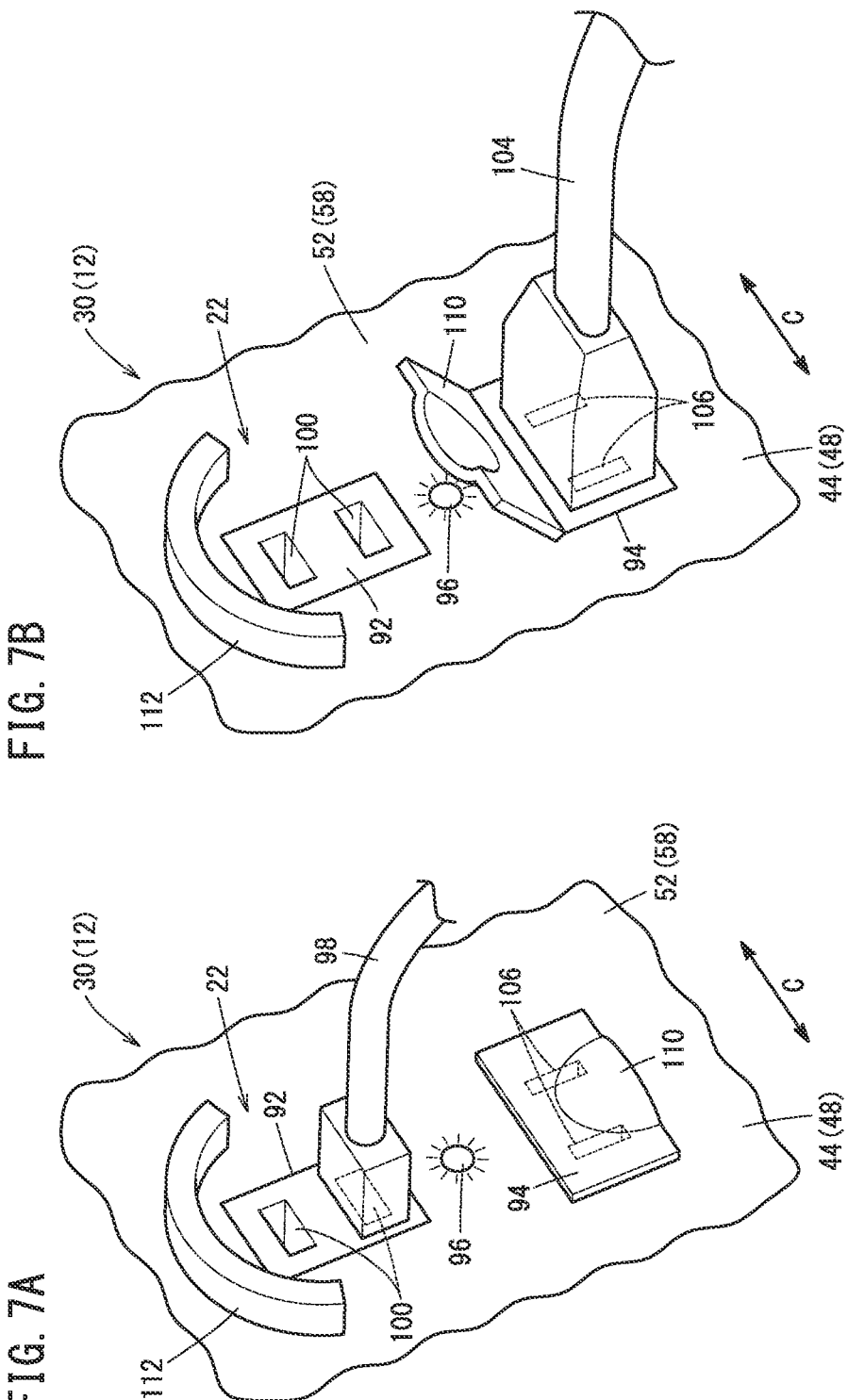
FIG. 7A is an enlarged perspective view of the output terminal and shows a state in which a first outputting member is connected to a first terminal portion.
FIG. 7B is an enlarged perspective view of the output terminal and shows a state in which a second outputting member is connected to a second terminal portion.

As shown in FIG. 6A, the first terminal portion 92 includes, for example, an output port 100 into and from which a first outputting member 98 can be inserted and removed. The output port 100 is, for example, a USB port. The first outputting member 98 is, for example, a cable for charging a first external device 102 such as a mobile phone. The first terminal portion 92 includes two output ports 100 that are arranged side by side and separated from each other in the up-down direction. The number of the output ports 100 is not limited to two. As shown in FIG. 7A, by inserting the first outputting member 98 into each of the output ports 100 of the first terminal portion 92, the first terminal portion 92 and the first outputting member 98 are electrically connected to each other. The electric power of the battery 60 is supplied to the first outputting member 98 through the first terminal portion 92.

The second terminal portion 94 is disposed substantially flush with the rear surface 52 of the cover body 44 (see FIG. 4). As shown in FIG. 5, the second terminal portion 94 is electrically connected to the controller 72. The second terminal portion 94 is electrically connected to the battery 60 via the controller 72. The second terminal portion 94 is electrically connected to the battery 60 and is supplied with electric power from the battery 60.

As shown in FIG. 7B, the second terminal portion 94 includes, for example, an outlet 106 to which a second outputting member 104 can be connected. The second outputting member 104 is, for example, an AC plug of a household electrical appliance, which is a second external device 108 (see FIG. 4). As shown in FIG. 6A, the second terminal portion 94 is disposed below the first terminal portion 92 to be separated therefrom. The first terminal portion 92 and the second terminal portion 94 are arranged on a straight line in the up-down direction of the cover 30.

As shown in FIG. 6A, the second terminal portion 94 includes a cap 110. The cap 110 is disposed so as to cover the outlet 106. When the second terminal portion 94 is not used, the cap 110 prevents dust and moisture from entering the outlet 106. As shown in FIG. 7B, when the outlet 106 is used, the user M pivots the cap 110 upward, whereby outlet 106 can be exposed to the outside.

By inserting the second outputting member 104 into the outlet 106 of the second terminal portion 94, the second terminal portion 94 and the second outputting member 104 are electrically connected to each other. The electric power of the battery 60 is supplied to the second external device 108 including the second outputting member 104, through the second terminal portion 94.

As shown in FIG. 6A, the lamp 96 is lit when electric power can be supplied from the battery 60 to the first and second terminal portions 92 and 94. The lamp 96 is disposed between the first terminal portion 92 and the second terminal portion 94. The lamp 96 is electrically connected to the controller 72. The position of the lamp 96 is not limited to being between the first terminal portion 92 and the second terminal portion 94, and the lamp 96 may be disposed at any position as long as it is in the vicinity of the output terminal 22. It should be noted that, instead of providing the lamp 96, at least a part of the output terminal 22 (one or both of the first and second terminal portions 92 and 94) may be lit when electric power can be supplied from the battery 60 to the first and second terminal portions 92 and 94.

The rear surface 52 of the cover 30 includes an overhanging portion 112. The overhanging portion 112 is disposed above the first terminal portion 92 of the output terminal 22. The overhanging portion 112 protrudes from the rear surface 52 (see FIG. 7A). The overhanging portion 112 has an arc shape that is convex toward the top surface 56 side. As shown in FIG. 6A, the overhanging portion 112 is disposed away from the upper side of the first terminal portion 92. The overhanging portion 112 covers the first terminal portion 92 from above. The overhanging portion 112 is disposed on the left part of the rear surface 52 of the cover 30. When water, dust, or the like is scattered to the output terminal 22 from above, adhesion of water, dust, or the like to the output terminal 22 is suppressed by the overhanging portion 112.

The rear surface 52 of the cover 30 includes a holding portion 114 that can hold the first external device 102. The holding portion 114 has a bag shape that opens upward. The holding portion 114 is disposed on the right side of the output terminal 22. When charging the first external device 102 by connecting the first outputting member 98 to the first terminal portion 92, the first external device 102 is inserted into the holding portion 114 to be held, whereby charging can be performed without the user M continuing to hold the first external device 102 during charging. It should be noted that, as shown in FIG. 6B, when the output terminal 22 is disposed on the right side, the holding portion 114 is disposed on the left side of the output terminal 22.

As shown in FIG. 2, the sensor 24 is disposed at the front portion of the body 28 of the machine body 12. Sensor information 24a (see FIG. 9) of the machine body 12 as detected by the sensor 24 is output to the controller 72 and displayed on the display device 26. The sensor 24 includes an imaging portion 116 disposed so as to face forward of the machine body 12 (in the arrow A direction).

The imaging portion 116 includes a camera 118 capable of capturing a video and an image of the area in front of the machine body 12. The imaging portion 116 is disposed at the center of the machine body 12 in the left-right direction. As shown in FIG. 3, the imaging portion 116 is disposed below the upper end of the cover 30 in the vertical direction (the arrow D direction). The imaging portion 116 is fixed to the upper surface of the body 28. As shown in FIG. 5, the imaging portion 116 is electrically connected to the display device 26, and is electrically connected to the controller 72 via the display device 26. The height of the imaging portion 116 in the vertical direction is a height corresponding to the grass growing on the ground U. Imaging information 116a (see FIG. 9) such as a video and an image captured by the imaging portion 116 is output to and displayed on the display device 26.

As shown in FIG. 3, a GPS receiving portion 120 is mounted inside the cover 30. The GPS receiving portion 120 can receive signals from satellites. As shown in FIG. 5, the GPS receiving portion 120 is electrically connected to the display device 26, and is electrically connected to the controller 72 via the display device 26. A current position P (see FIG. 10) of the electric working machine 10 can be identified by outputting the signals received by the GPS receiving portion 120 to the controller 72.

As shown in FIG. 2, the display device 26 is disposed at the support members 76a and 76b of the handle 18. The display device 26 is disposed parallel to the grip portion 78. The display device 26 is arranged above the support members 76a and 76b (see FIG. 3). The display device 26 is disposed forward of (further in the arrow A direction than) the operation part 20. The display device 26 and the operation part 20 are separated from each other in the traveling direction of the electric working machine 10. The drive unit 42 including the motor 14 is disposed between the display device 26 and the imaging portion 116. The display device 26 is disposed rearward of the power supply portion 88 (on the grip portion 78 side). It is favorable since a display 122 of the display device 26 is not blocked by the power supply portion 88.

The display device 26 includes the display 122 and a frame 124.

Figure 8:
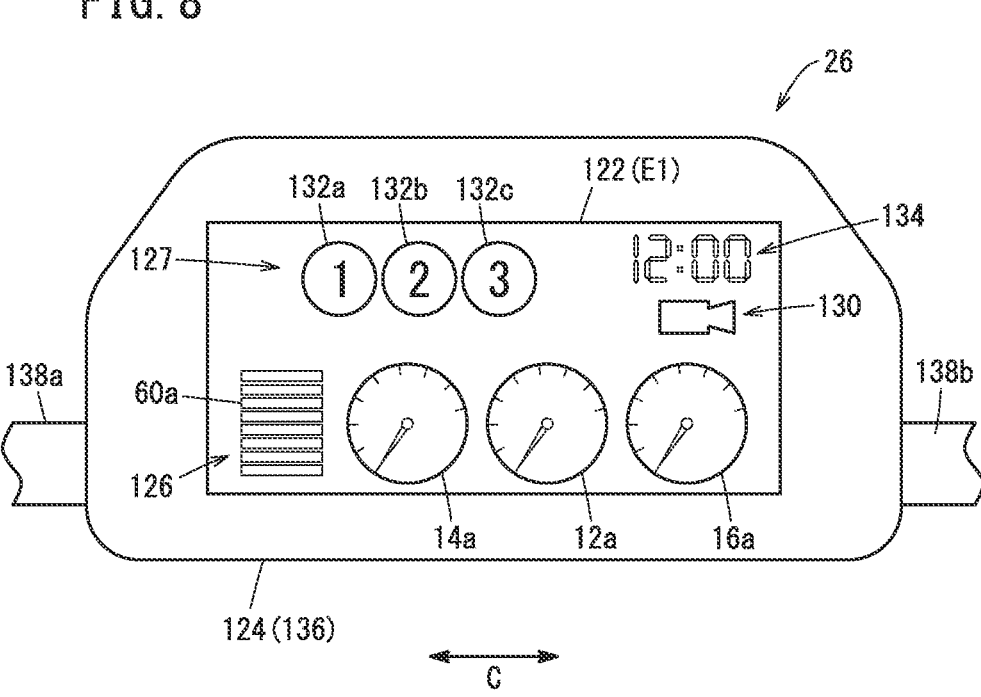
FIG. 8 is an enlarged front view of a display device on which a first screen is displayed.

As shown in FIG. 8, the display 122 is, for example, a sensitive panel display. The panel display is, for example, a liquid crystal panel or an organic EL panel. The display 122 has a rectangular shape elongated in the left-right direction (the arrow C direction). As shown in FIG. 5, the display 122 is electrically connected to the imaging portion 116 and the GPS receiving portion 120. The display 122 is electrically connected to the controller 72.

The display 122 has a display function, an input function, a screen switching function, and a time display function. The display function allows working machine information of the electric working machine 10 to be displayed. The display 122 can switch between a first screen E1 (see FIG. 8) and a second screen E2 (see FIG. 9) by a switching section 130 having the screen switching function.

As shown in FIG. 8, a working machine state display section 126 and a setting input section 127 can be displayed on the first screen E1.

Various kinds of information of the electric working machine 10 can be displayed on the working machine state display section 126. The working machine state display section 126 is displayed, for example, in the lower half of the display 122 on the first screen E1. Two or more pieces of working machine state information among operation speed information 16a of the working part 16, electric power information 60a of the battery 60, drive information 14a of the motor 14, traveling speed information 12a of the machine body 12 (the electric working machine 10), and position information 12b of the electric working machine 10 (the machine body 12), can be selected and simultaneously displayed on the working machine state display section 126. On the first screen E1, a plurality of pieces of working machine state information are displayed side by side in the left-right direction of the display 122 (the arrow C direction).

Hereinafter, a case where four pieces of working machine state information are simultaneously displayed will be described. In FIG. 8, the electric power information 60a of the battery 60, the drive information 14a of the motor 14, the traveling speed information 12a of the electric working machine 10 (the machine body 12), and the operation speed information 16a of the working part 16 are displayed in this order from left to right.

The operation speed information 16a of the working part 16 is, for example, the rotational speed of the cutter blade 70. The electric power information 60a of the battery 60 is, for example, the remaining electric power amount of the battery 60. The drive information 14a of the motor 14 is, for example, the rotational speed of the motor 14 when driven. The position information of the electric working machine 10 is the current position P (see FIG. 10) of the electric working machine 10 calculated based on the signals received from the GPS receiving portion 120.

Figure 9:
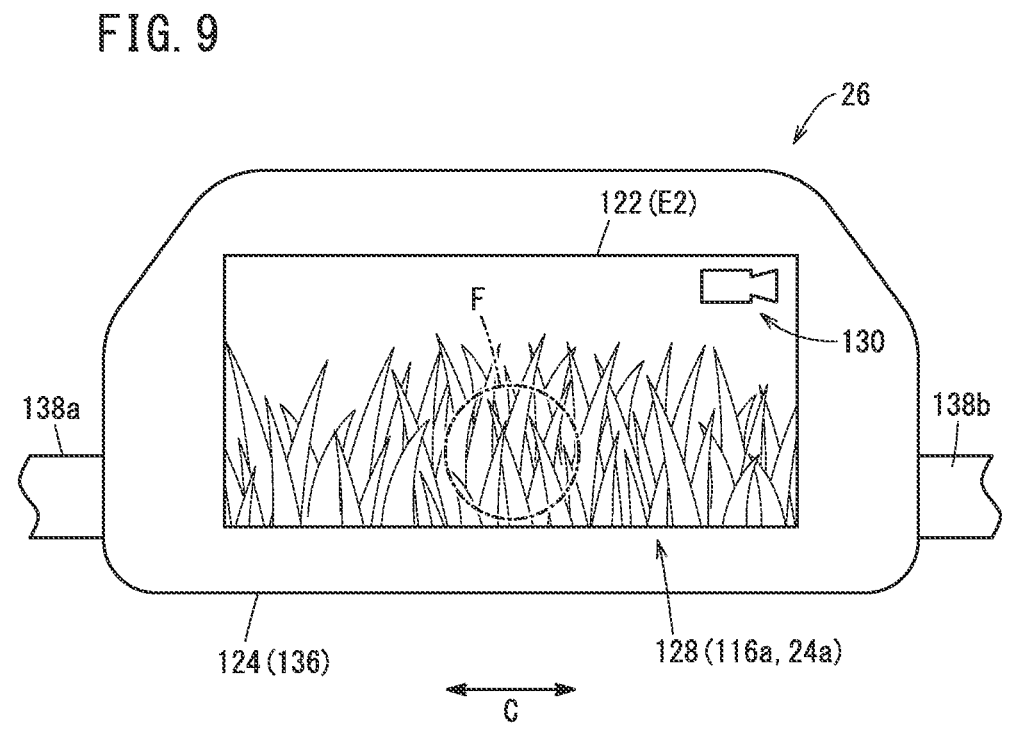

As shown in FIG. 9, the imaging information 116a obtained by the imaging portion 116 can be displayed on the second screen E2. The imaging information 116a is a video and an image of the area in front of the machine body 12 as captured by the imaging portion 116. The imaging information 116a can be displayed on the entire second screen E2 (the display 122).

In FIG. 8, the setting input section 127 can receive a setting related to the operation of the working part 16 from the user M. The setting input section 127 displays a plurality of options for the user M to select a work mode of the working part 16. The user M can select and input a work mode of the working part 16 to the setting input section 127. As shown in FIG. 8, the setting input section 127 is displayed above the working machine state display section 126 on the first screen E1. That is, on the first screen E1 of the display 122, the working machine state display section 126 and the setting input section 127 are simultaneously displayed.

The setting input section 127 includes, for example, first to third mode input portions 132a, 132b, and 132c. The first to third mode input portions 132a, 132b, and 132c are independently arranged side by side in the left-right direction of the display 122 (the arrow C direction). Each of the first to third mode input portions 132a, 132b, and 132c is a sensitive operation portion that can electrically sense the touch of the user M.

The first mode input portion 132a corresponds to a high-output mode and is selected when the working part 16 is operated at a high output. The second mode input portion 132b corresponds to a normal mode, and is selected when the working part 16 is operated at a normal output. The third mode input portion 132c corresponds to a silent mode and is selected when it is desired to suppress the output of the working part 16 to reduce the operating sound. When the user M touches any one of the first to third mode input portions 132a, 132b, and 132c, an electric signal corresponding to each of the first to third mode input portions 132a, 132b, and 132c is output to the controller 72, and the controller 72 controls the motor 14 to adjust the driving force of the motor 14.

The switching section 130 is arranged on the first and second screens E1 and E2. When the user M touches the switching section 130, the first screen E1 and the second screen E2 can be alternately switched. By appropriately switching between the first screen E1 and the second screen E2 according to information or the like required by the user M, it is possible to access the working machine state display section 126 and the setting input section 127, and the imaging information 116a. That is, the first screen E1 capable of displaying the working machine state display section 126 and the setting input section 127, and the second screen E2 capable of displaying the imaging information 116a, can be alternately switched and displayed on the display 122.

As shown in FIG. 8, the time display function is arranged on the first screen E1. The time display function includes a clock 134 capable of displaying the current time.

As shown in FIG. 8, the frame 124 holds the display 122. The frame 124 includes a frame body 136 surrounding the display 122, and a pair of frame shaft portions 138a and 138b extending from the frame body 136 in the left-right direction. The frame body 136 has a rectangular shape constituting an outer frame of the display device 26.

As shown in FIG. 2, the frame shaft portions 138a and 138b protrude in the left-right direction from the lower end of the frame body 136. The end portions of the frame shaft portions 138a and 138b are pivotally supported by the pair of support members 76a and 76b by fasteners 140. By pivoting the display device 26 via the frame shaft portions 138a and 138b, it is possible to adjust the angle of the display 122 to a position directly facing the eyes of the user M when the user M visually recognizes the display 122 (see FIG. 3). After the angle of the display device 26 with respect to the handle 18 is adjusted, the display device 26 is fixed to the support members 76a and 76b of the handle 18 by tightening the fasteners 140. The fasteners 140 are disposed forward of the connecting sections between the blade operating portion 86 and the support members 76a and 76b.

Next, the operation of the electric working machine 10 will be described. Here, a case where grass is cut by the electric working machine 10 will be described.

Figure 10:
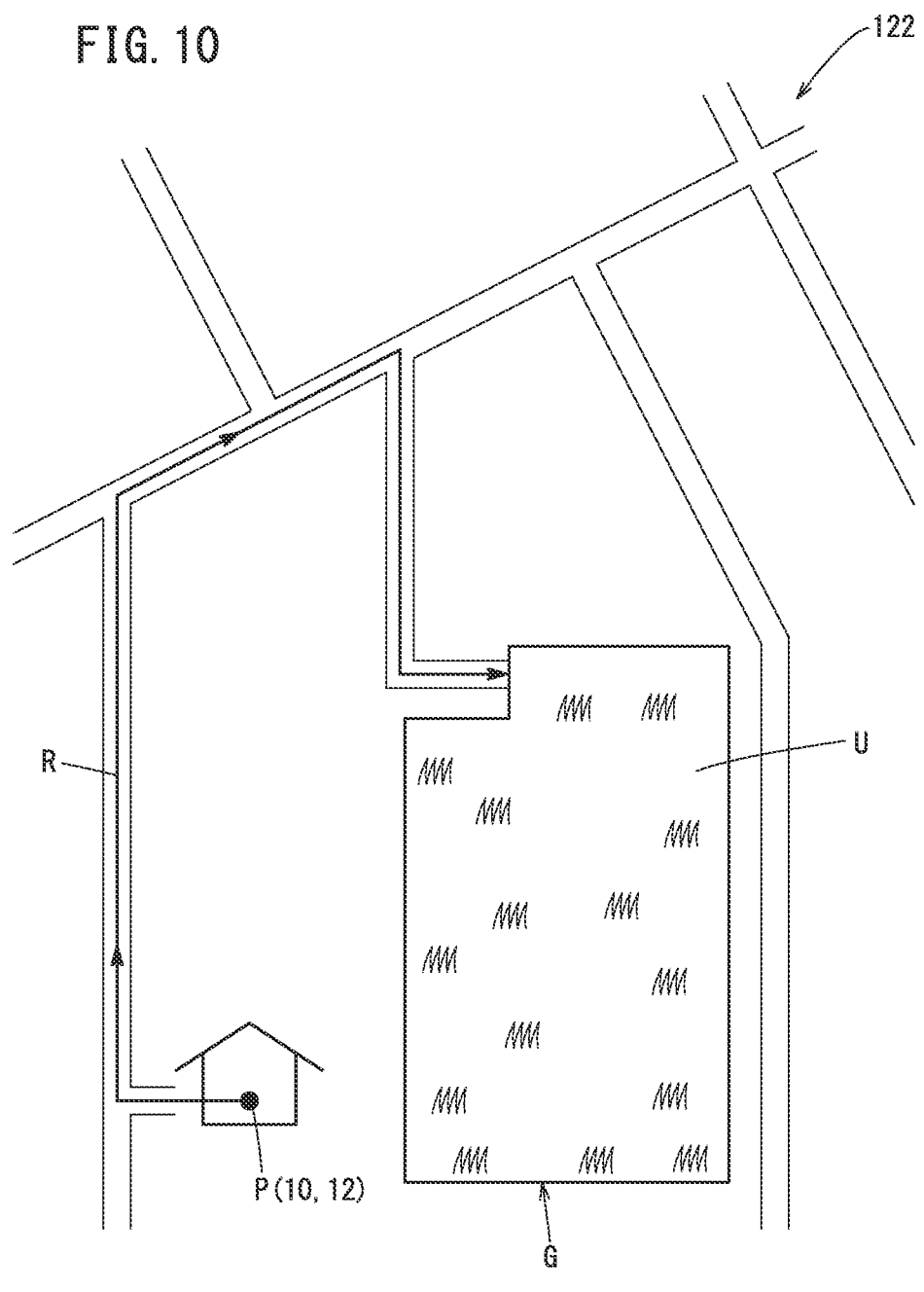
FIG. 10 is an enlarged view of a display on which a movement path of the electric working machine from a current position to a work site is displayed.

First, position information about the current position P of the electric working machine 10 is acquired based on a signal received by the GPS receiving portion 120. As shown in FIG. 10, the current position P of the electric working machine 10 (machine body 12) is displayed on the display 122 based on map data stored in advance in the controller 72 and the position information 12b. When the user M inputs a place to be a work site G (destination) where the lawn mowing work is performed, the controller 72 calculates an optimum movement path R from the current position P to the work site G. The movement path R is displayed on the display 122 together with the map data. The required power consumption of the battery 60 is calculated by the controller 72 based on information such as the length of the movement path R, the work area at the work site G, the gradient, and the altitude. The power consumption of the battery 60 is displayed on the display 122, so that the user M can confirm the power consumption.

As shown in FIG. 3, the user M moves to the rear of the handle 18 of the electric working machine 10, and in a state where the user M grips the grip portion 78 of the handle 18, the display device 26 is pivoted to adjust the angle of the display device 26 to an angle at which the user M can easily view the display device 26. The angle at which the user M can easily view the display device 26 is an angle at which the display 122 of the display device 26 directly faces the eyes of the user M. At this time, since the display device 26 is disposed parallel to the grip portion 78, irradiation of sunlight onto the display device 26 is suitably blocked by the user M. Therefore, reflection of sunlight at the display 122 is less likely to occur, and the user M can easily visually recognize the display 122 even outdoors.

Next, the user M operates the power switch 90 of the power supply portion 88 to turn on the power supply. At this time, since the power switch 90 is disposed on the outer side (the right side) of the display device 26, the operation of the power switch 90 is not hindered by the display device 26. When the user M operates the movement operating portion 84 of the operation part 20, the rear wheels 36 rotate along with the rotation of the motor 14, and the electric working machine 10 travels. The electric working machine 10 is moved to the work site G along the movement path R (see FIG. 10). At the work site G, when the user M grips the blade operating portion 86 and pulls it toward the movement operating portion 84, the motor 14 is driven and the cutter blade 70 starts to rotate. At this time, since the fasteners 140 are disposed forward of the connecting sections between the blade operating portion 86 and the support members 76a and 76b, the blade operating portion 86 and the display device 26 do not interfere with each other when the blade operating portion 86 is pulled toward the movement operating portion 84. By the rotation of the cutter blade 70, the tip of the grass is cut by the plurality of cutting edges 74. When the electric working machine 10 travels along the ground U while rotating the cutter blade 70, the grass is cut at a constant height along the traveling direction of the electric working machine 10.

At this time, as shown in FIG. 9, by switching the display 122 of the display device 26 to the second screen E2, the user M can confirm the video or image of the area in front of the machine body 12 on the display 122. For example, when an obstacle F (indicated by a two dot chain line in FIG. 9) has fallen in front of the machine body 12, the user M can stop traveling of the electric working machine 10 by confirming the obstacle F or the like on the display 122. This prevents the obstacle F or the like from entering the lower portion of the machine body 12 and coming into contact with the cutter blade 70.

When the user M operates the switching section 130 of the display 122 to switch to the first screen E1 during the lawn mowing work by the working part 16, the user M can confirm, on the working machine state display section 126, the electric power information 60a (the remaining electric power amount) of the battery 60, the drive information 14a (the rotational speed) of the motor 14, the traveling information (the speed) of the electric working machine 10, the operation speed information 16a of the working part 16 (the rotational speed of the cutter blade 70), and the like. By operating the switching section 130, two or more pieces of information among a plurality of pieces of information about the electric working machine 10 can be selected and simultaneously displayed on the display 122.

The user M can change the work mode of the working part 16 based on various pieces of information displayed on the working machine state display section 126. When any one of the first to third mode input portions 132a, 132b, and 132c of the setting input section 127 is touched on the first screen E1 of the display 122, a control signal corresponding to each of the mode input portions is output from the controller 72 to the motor 14. The rotational speed of the cutter blade 70 is adjusted by controlling the motor 14.

When the user M touches the first mode input portion 132a, the high-output mode is set in which the rotational speed of the cutter blade 70 increases as compared with the normal mode. In the high-output mode, the cutter blade 70 rotates at a higher speed than in the normal mode. As a result, the grass can be reliably cut by the cutter blade 70 even in the case of the grass growing at high density.

When the user M touches the third mode input portion 132c, the silent mode is set in which the rotational speed of the cutter blade 70 decreases as compared with the normal mode. In the silent mode, the cutter blade 70 rotates at a lower speed than in the normal mode. As a result, when performing work in a situation where quietness is required, such as in the early morning or at night, it is possible to suppress the sound generated with rotation of the cutter blade 70. That is, the lawn mowing work is performed using the cutter blade 70 of the working part 16 based on the work mode selected by the user M.

After the work by the electric working machine 10 is completed, the electric working machine 10 is moved from the work site G (see FIG. 10) to a predetermined position and stored. At this time, as shown in FIG. 4, the user M grips the grip portion 78 of the handle 18 and pivots the handle 18 forward (in the arrow A direction) about the pivot portions 80. Accordingly, the pair of support members 76a and 76b are disposed in the left-right direction of the cover 30, and the grip portion 78 is disposed forward of the front wheels 34. The handle 18 is housed so as to extend substantially horizontally toward the front from the pivot portions 80. Therefore, when the electric working machine 10 is not in use, the handle 18 does not extend to the rear of the machine body 12 (in the arrow B direction), and the electric working machine 10 can be stored compactly.

At this time, since the display device 26 is disposed in a space forward of (further in the arrow A direction than) the cover 30, contact between the machine body 12 including the cover 30, and the display device 26 is avoided. In other words, the display device 26 can be suitably housed in the space disposed forward of the cover 30.

A case where electric power is supplied from the electric working machine 10 to the first external devices 102 and 108 when the electric working machine 10 is not in use will be described.

First, as shown in FIG. 7A, the user M confirms that the lamp 96 is lit and electric power can be supplied from the battery 60. When the battery 60 is accommodated in the battery accommodating portion 32 and the remaining electric power amount of the battery 60 is sufficient, electric power is supplied to the lamp 96 via the controller 72, and the lamp 96 is lit.

The lamp 96 is off, for example, when the battery 60 is not accommodated in the battery accommodating portion 32, when the remaining electric power amount of the battery 60 is equal to or less than a predetermined value corresponding to the electric power amount necessary for operating the working part 16 and the electric power amount necessary for traveling, or when electric power cannot be output to the output terminal 22 due to a connection failure of the battery 60 or the like.

After the user M confirms lighting of the lamp 96, the user M moves to the left side of the electric working machine 10 (machine body 12) as shown in FIG. 2. The output terminal 22 is disposed on the left part of the rear surface 52 of the cover 30. Therefore, when the user M stands on the left side of the machine body 12, the user M and the output terminal 22 are close to each other, and the user M who is right-handed can easily insert and remove the first and second outputting members 98 and 104 into and from the output terminal 22.

When the first outputting member 98 is connected to the first terminal portion 92 as shown in FIG. 7A, the connecting end of the first outputting member 98 is inserted into the output port 100 of the first terminal portion 92. The first outputting member 98 is connected to the first external device 102 in advance (see FIG. 6A). Electric power of the battery 60 is supplied from the first outputting member 98 to the first external device 102 via the first terminal portion 92 of the output terminal 22. Thus, the first external device 102 is charged with the electric power of the battery 60. As shown FIG. 6A, by inserting the first external device 102 into the holding portion 114 of the cover 30 during charging of the first external device 102, the user M does not need to hold the first external device 102, which is favorable.

In the case where the first external device 102 is, for example, a mobile phone or the like including a display portion 102a, the display portion 102a of the first external device 102 may be used instead of the display device 26 without providing the display device 26.

After the charging of the first external device 102 from the output terminal 22 is completed, the connecting end of the first outputting member 98 is removed from the output port 100 of the first terminal portion 92. At this time, as shown in FIG. 4, the direction in which the first outputting member 98 is inserted into or removed from the first terminal portion 92 is a direction orthogonal to the rear surface 52 (the inclined portion 58) of the cover 30.

When the second outputting member 104 is connected to the second terminal portion 94 as shown in FIG. 7B, the user M grips and opens the cap 110 and then inserts the second outputting member 104 of the second external device 108 (see FIG. 4) into the outlet 106. Electric power of the battery 60 is supplied from the second outputting member 104 to the second external device 108 via the second terminal portion 94 of the output terminal 22. As a result, it is possible to operate the second external device 108 using the electric power of the battery 60.

When the power supply from the output terminal 22 to the second external device 108 is finished, the second outputting member 104 is removed from the outlet 106 of the second terminal portion 94. As shown in FIG. 4, the direction in which the second outputting member 104 is inserted into or removed from the second terminal portion 94 is a direction orthogonal to the rear surface 52 (the inclined portion 58) of the cover 30.

The power supply from the output terminal 22 to the first and second external devices 102 and 108 is not limited to when the electric working machine 10 is not in use. While the electric working machine 10 is traveling or working, the power supply may be performed by connecting the first and second outputting members 98 and 104 to the output terminal 22.

When the remaining electric power amount of the battery 60 becomes equal to or less than the predetermined value, the controller 72 stops the power supply from the battery 60 to the output terminal 22. At this time, since the lamp 96 is turned off, the user M can confirm by the lamp 96 that electric power cannot be supplied from the output terminal 22.

As shown in FIG. 4, the direction in which the first and second outputting members 98 and 104 are inserted into or removed from the output terminal 22 is different from the direction in which the battery 60 is attached to or detached from the battery accommodating portion 32 of the cover 30, and the line of movement during the insertion/removal does not overlap the line of movement during the attachment/detachment. Therefore, during the power supply from the output terminal 22 to the first and second external devices 102 and 108, when the battery 60 is attached or detached for replacement, the first and second outputting members 98 and 104 do not interfere with the attachment or detachment operation of the battery 60.

As described above, in the embodiment of the present invention, since the cover 30 that covers the motor 14 includes the output terminal 22 for supplying the electric power of the battery 60 to the outside, the electric power can be supplied from the output terminal 22 to the first and second external devices 102 and 108. Thus, when the electric working machine 10 is used outdoors, electric power can be supplied to the first and second external devices 102 and 108 by using the electric working machine 10 as a mobile power source for the first and second external devices 102 and 108.

The opening direction of the opening 62 of the battery accommodating portion 32 capable of accommodating the battery 60 is different from the insertion/removal direction of the first and second outputting members 98 and 104 that are attached to and detached from the output terminal 22, and therefore, when attaching or detaching the battery 60 to or from the battery accommodating portion 32 in a state where the first and second outputting members 98 and 104 are connected to the output terminal 22, interference between the first and second outputting members 98 and 104, and the battery 60, is prevented.

By disposing the output terminal 22 on the inclined portion 58 of the cover 30, the user M can easily visually recognize the output terminal 22 and can easily insert and remove the first and second outputting members 98 and 104 into and from the output terminal 22.

The output terminal 22 is disposed at a position rearward of the front wheels 34 so as to face rearward, and therefore, when the electric working machine 10 travels forward (in the arrow A direction) while the first and second outputting members 98 and 104 are connected to the output terminal 22, the first and second outputting members 98 and 104 are prevented from being entangled with the front wheels 34 or the working part 16. When the electric working machine 10 travels, soil, grass, and the like scattering from the front to the rear in the traveling direction are unlikely to adhere to the output terminal 22.

The operation part 20 is disposed rearward of (further in the arrow B direction than) the output terminal 22. Therefore, when the user M operates the operation part 20, the user M faces the output terminal 22 disposed on the cover 30, whereby the user M can visually recognize the output terminal 22. Accordingly, the user M can reliably and easily confirm the state of connection of the first and second outputting members 98 and 104 to the output terminal 22.

The output terminal 22 is disposed on the left part of the rear surface 52 of the cover 30, and therefore, when the user M stands on the left side of the machine body 12, the output terminal 22 is located at a position where the right hand of the user M can easily reach. Therefore, the user M who is right-handed can easily insert and remove the first and second outputting members 98 and 104 into and from the output terminal 22.

As shown in FIG. 6B, in a case where the output terminal 22 is disposed on the right part of the rear surface 52 of the cover 30, when the user M stands on the right side of the machine body 12, the output terminal 22 is located at a position where the left hand of the user M can easily reach. Therefore, the user M who is left-handed can easily insert and remove the first and second outputting members 98 and 104 into and from the output terminal 22.

The cover 30 is provided with the lamp 96 which is lit when electric power can be supplied from the battery 60 to the output terminal 22. Therefore, when the battery 60 is not accommodated in the battery accommodating portion 32, or when electric power cannot be output to the output terminal 22 due to a connection failure of the battery 60 or the like, the lamp 96 is turned off, whereby it is possible to cause the user M to recognize that electric power cannot be supplied from the output terminal 22.

Since the cover 30 includes the overhanging portion 112 that covers the output terminal 22 from above, it is possible to prevent water from directly adhering to the output terminal 22 by the overhanging portion 112 in rainy weather or in an environment in which water droplets fall on the machine body 12. The overhanging portion 112 can prevent the scattered soil or grass from adhering to the output terminal 22 from above.

By connecting the first external device 102 including the display portion 102*a* to the output terminal 22, the operating state or driving state of the electric working machine 10 can be displayed on the display portion 102*a* of the first external device 102 held by the holding portion 114 of the cover 30, instead of the display device 26. The electric power supplied from the output terminal 22 can be used to drive the first external device 102.

When the electric power of the battery 60 starts to decrease, the supply of the electric power to the output terminal 22 is stopped by the controller 72, whereby the electric power for traveling and the electric power for working of the electric working machine 10 can be left.

The above embodiment can be summarized as follows.

The above embodiment relates to the electric working machine (10) including: the machine body (12); the motor (14) mounted on the machine body and driven by the electric power supplied from the battery (60); the working part (16) driven by the motive power of the motor and configured to perform work; and the cover (30) configured to cover the motor, the electric working machine further including the output terminal (22) disposed on the cover and configured to supply the electric power of the battery to the outside.

The machine body includes the battery accommodating portion (32) capable of accommodating the battery therein, the battery accommodating portion includes the opening (62) through which the battery is inserted and removed, the battery is attachable to and detachable from the battery accommodating portion through the opening, and the opening direction of the opening of the battery accommodating portion is different from the insertion/removal direction of the outputting member (98, 104) that is attached to and detached from the output terminal.

The outer surface (48) of the cover includes the inclined portion (58) inclined with respect to the vertical direction and facing obliquely upward, and the output terminal is disposed on the inclined portion.

The wheels (34, 34*a*, 34*b*) are disposed at least at the front portion of the machine body, and the output terminal is disposed at a position rearward of the wheels so as to face rearward.

The electric working machine (10) includes the operation part (20) operated by the user (M) and configured to control the operation of at least one of the working part or the motor, and the operation part is disposed rearward of the output terminal.

The rear portion of the cover includes the rear surface (52) facing rearward, and the output terminal is disposed on the left part of the rear surface.

The rear portion of the cover includes the rear surface facing rearward, and the output terminal is disposed on the right part of the rear surface.

The machine body includes the lamp (96) configured to be lit when the electric power can be supplied from the battery to the output terminal.

The cover is provided with the overhanging portion (112) configured to cover the output terminal from above.

The external device (102) including the display portion (102*a*) is connectable to the output terminal, and the cover includes the holding portion (114) capable of holding the external device.

The electric working machine (10) includes the controller (72) configured to control the motor and control supply of the electric power of the battery, and the controller stops the supply of the electric power from the battery to the output terminal when the remaining electric power of the battery is equal to or less than the predetermined value.

The present invention is not limited to the above disclosure, and various modifications are possible without departing from the essence and gist of the present invention.

The invention claimed is:

1. An electric working machine, comprising:

a machine body;

a motor mounted on the machine body and driven by electric power supplied from a battery;

a working part driven by motive power of the motor and configured to perform work;

a cover configured to cover the motor; and an output terminal disposed on the cover and configured to supply the electric power of the battery to an outside, wherein the output terminal comprises a first terminal portion having a first output port and a second terminal portion having a second output port, wherein a rear surface of the cover comprises a holding portion having a bag shape that opens outwardly away from the rear surface and which is configured to open at an upper portion thereof to accommodate an external device connected to one of the first output port or the second output port of the output terminal, and wherein in the rear surface of the cover, the output terminal and the holding portion are separated from each other in a lateral direction extending laterally relative to a base surface supporting the electric working machine, and the first terminal portion and the second terminal portion are separated from each other in a vertical direction projecting vertically from the base surface.

2. The electric working machine according to claim 1, wherein the machine body comprises a battery accommodating portion configured to accommodate the battery therein, the battery accommodating portion comprises an opening through which the battery is inserted and removed, the battery is attachable to and detachable from the battery accommodating portion through the opening, and an opening direction of the opening of the battery accommodating portion is different from an insertion/removal direction of an outputting member that is attached to and detached from the output terminal.

3. The electric working machine according to claim 1, wherein an outer surface of the cover comprises an inclined portion inclined with respect to a vertical direction and facing obliquely upward, and the output terminal is disposed on the inclined portion.

4. The electric working machine according to claim 1, wherein a wheel is disposed at least at a front portion of the machine body, and the output terminal is disposed at a position rearward of the wheel so as to face rearward.

5. The electric working machine according to claim 4, further comprising:

an operation part operated by a user and configured to control an operation of at least one of the working part or the motor, wherein the operation part is disposed rearward of the output terminal.

6. The electric working machine according to claim 5, wherein a rear portion of the cover comprises the rear surface facing rearward, and the output terminal is disposed on the rear surface.

7. The electric working machine according to claim 1, wherein the machine body comprises a lamp configured to be lit when the electric power is allowed to be supplied from the battery to the output terminal.

8. The electric working machine according to claim 1, wherein the cover comprises an overhanging portion configured to cover the output terminal from above.

9. The electric working machine according to claim 1, wherein the holding portion is configured to hold the external device comprising a display portion.

10. The electric working machine of claim 1, wherein the first terminal portion is spaced apart from the second terminal portion along the cover by a portion of the cover.

11. The electric working machine of claim 1, wherein a lamp is disposed, at the cover, spaced between the first terminal portion and the second terminal portion.

* * * * *